United States Patent

Hsia et al.

[11] Patent Number: 5,909,621
[45] Date of Patent: Jun. 1, 1999

[54] SINGLE-SIDE CORRUGATED CYLINDRICAL CAPACITOR STRUCTURE OF HIGH DENSITY DRAMS

[75] Inventors: Liang-Choo Hsia, Taipei; Thomas Chang, Taichung, both of Taiwan

[73] Assignee: Mosel Vitelic Inc., Hsinchu, Taiwan

[21] Appl. No.: 08/795,789

[22] Filed: Feb. 5, 1997

[51] Int. Cl.$^6$ ............................................. H01L 21/8242
[52] U.S. Cl. .......................................... 438/254; 438/240
[58] Field of Search .................................... 438/238, 240, 438/253, 254, 396, 397, 3; 257/306, 308, 310

[56] References Cited

U.S. PATENT DOCUMENTS

| | | | |
|---|---|---|---|
| 5,170,233 | 12/1992 | Liu et al. | 257/308 |
| 5,384,276 | 1/1995 | Ogawa et al. | 437/52 |
| 5,409,856 | 4/1995 | Jun | 437/52 |
| 5,656,536 | 8/1997 | Wu | 438/397 |

OTHER PUBLICATIONS

"Silicon Processing for the VLSI Era, vol. 1—Process Technology" by S. Wolf and R.N. Tauber, Lattice Press, 1986 (pp. 188–191).

*Primary Examiner*—Joni Chang
*Attorney, Agent, or Firm*—Bacon & Thomas, PLLC

[57] ABSTRACT

A method of fabricating single-side corrugated cylindrical capacitor of high density Dynamic Random Access Memory (DRAM) cells. The corrugated capacitor shape is achieved by depositing the thermal chemical vapor deposition (CVD) oxide and the plasma-enhanced CVD (PECVD) oxide alternating layers. Then, the thermal CVD oxide and the PECVD oxide layers are lateral etched by hydrofluoric acid (HF). Because hydrofluoric acid (HF) etches the thermal CVD oxide at a slower rate than etches the PECVD oxide, a cavity (undercut) is formed in each PECVD oxide layer. Therefore, the single-side corrugated shape capacitor surface is created that increases the surface area of the capacitor considerably. The cylindrical capacitor storage node of the DRAM capacitor of this method has much greater surface area so as to increase the capacitance value of the DRAM capacitor, that can achieve high packing density of the integrated circuit devices.

8 Claims, 11 Drawing Sheets

SINGLE-SIDE CORRUGATED CYLINDRICAL CAPACITOR STRUCTURE OF HIGH DENSITY DRAMS

BACKGROUND OF THE INVENTION (1) Field of the Invention

The present invention relates to a method of fabricating the capacitors of dynamic random access memory (DRAM) cells, and more particularly to the single-side corrugated cylindrical capacitor structure of high density DRAMs.

(2) Description of the Related Art

A DRAM cell comprises a metal-oxide-semiconductor field effect transistor (MOSFET) and capacitors which are built in a semiconductor silicon substrate. There is an electrical contact between the source of a MOSFET and the storage node of the adjacent capacitor, forming a memory cell of the DRAM device. A large number of memory cells make up the cell arrays which combine with the peripheral circuit to produce DRAMs.

In recent years, the sizes of the MOSFETs and capacitors have become continuously smaller so that the packing densities of these DRAM devices have increased considerable. For example, a number of semiconductor manufacturing companies in the world have already begun mass production of 16M bit or even 64M bit DRAMs.

In order to achieve high packing density, the cell size of a DRAM cell must shrink. As the sizes of the capacitors become smaller, so as the capacitance values of the capacitors are decreasing, that reduces the signal to noise ratio of the DRAM circuits, causing the performance problem. In order to maintain or even increase the value of the capacitance for smaller size capacitors, increasing the surface area of the polysilicon storage nodes or reducing the thickness of the dielectric layer is necessary.

Various shapes of capacitor structures have been used to address this issue. U.S. Pat. No. 5,185,282 to Lee et al. (the entire disclosure of which is herein incorporated by reference) provides a method of fabricating cup-shaped capacitor storage node. Another U.S. Pat. No. 5,021,357 to Taguchi et al. (the entire disclosure of which is herein incorporated by reference) supplies a method of fabricating fin structure capacitor electrode. These capacitor structures can effectively increase the capacitance values of the capacitors, however these processes are too complicated and highly fastidious. So they are difficult to be practically employed for mass-production.

Figure 1:
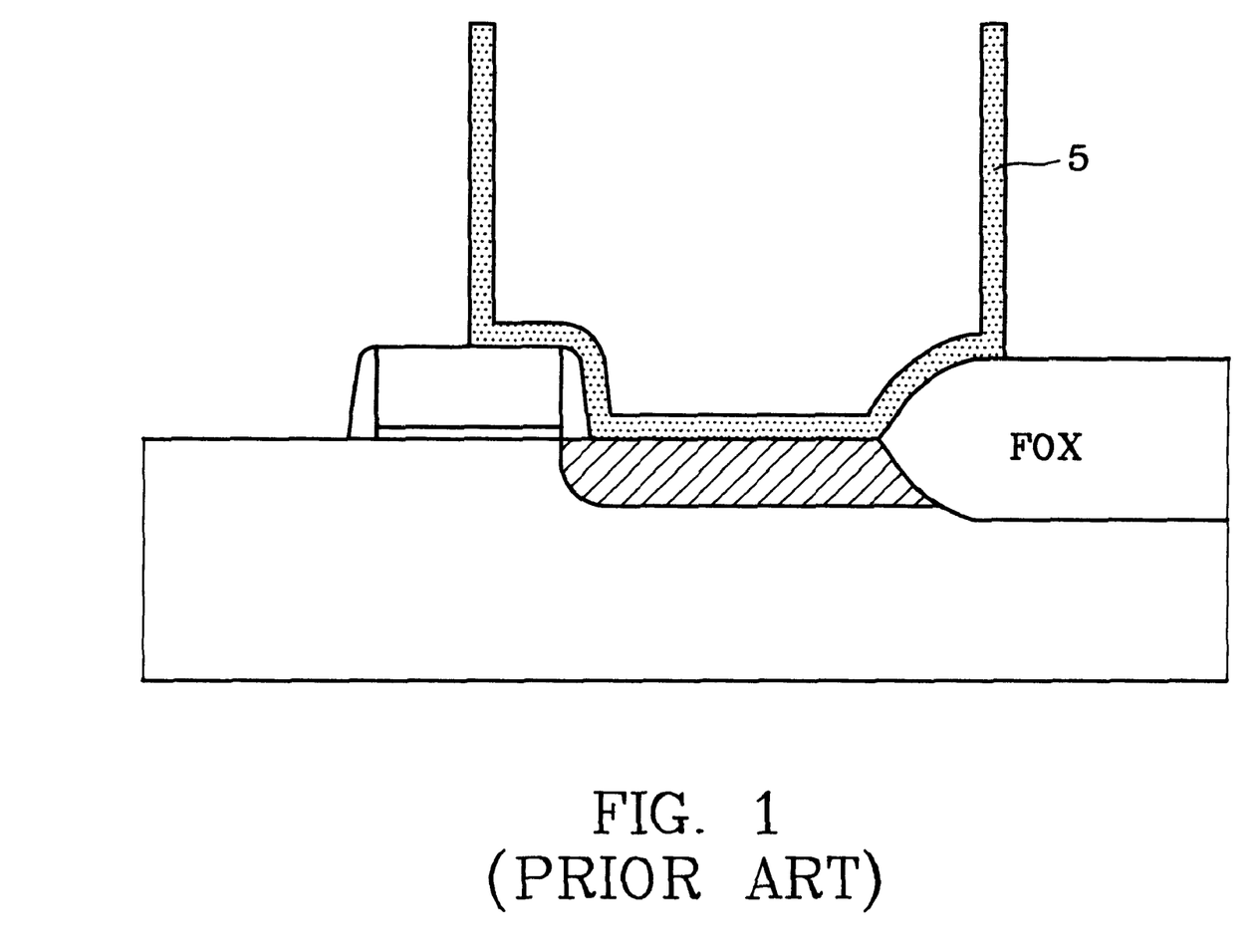
FIG. 1 is a cross sectional representation of the cylindrical capacitor of a DRAM cell according to the prior art.

Most recently, H. Watanabe et al. in IEDM 92 (the entire disclosure of which is herein incorporated by reference) discloses a method of fabricating cylindrical capacitor electrode. Please refer to FIG. 1, the cylindrical capacitor structure 5 increases the capacitor surface area tremendously without increasing the silicon area. The cylindrical capacitor structure is also more stable than the fin capacitor structure.

The present invention discloses a new method to fabricate high-capacitance cylindrical capacitors of high density DRAMs which further increases the capacitor surface area.

SUMMARY OF THE INVENTION

According, it is a primary object of the present invention to provide a method for a DRAM cell with greater capacitance per unit area.

It is another object of the present invention to provide a method of fabricating the single-side corrugated cylindrical capacitor of the high density DRAMs.

These objects are accomplished by the fabrication process described below.

First, a field oxide layer for isolation is grown on the semiconductor silicon substrate by standard integrated circuit fabrication process. Then, a MOSFET which includes gate oxide, gate electrode and source drain/regions are formed on the semiconductor silicon substrate.

Next, the first dielectric and second dielectric layers are sequentially deposited. The first and second dielectric layers are planarized and then etched by plasma-etching to expose the source region of the MOSFET in order to form a cell contact window of the DRAM cell.

Next, the first polysilicon layer which is overlaying the second dielectric layer and filling into the cell contact is formed. Then, a nitride dielectric layer is formed for etching stopper. The thermal chemical vapor deposition (CVD) oxide and the plasma-enhanced CVD (PECVD) oxide layers are alternatively formed overlaying the nitride dielectric layer.

Next, the thermal CVD oxide and the PECVD oxide alternating layers are formed capacitor pattern by the conventional lithography and plasma-etching techniques. Then, the thermal CVD oxide and the PECVD oxide layers are lateral etched by hydrofluoric acid (HF). Because hydrofluoric acid (HF) etches the thermal CVD oxide at a slower rate than etches the PECVD oxide, a cavity (undercut) is formed in each PECVD oxide layer. Therefore, the single-side corrugated shape capacitor surface is created, that is the key point of the present invention.

Next, the second polysilicon layer is formed overlaying the first polysilicon layer and the thermal CVD oxide/PECVD oxide alternating layer structure. The second polysilicon layer is then vertically anisotropically etched to form second polysilicon spacers on the sidewalls of the thermal CVD oxide/PECVD oxide alternating layer structure.

Finally, the thermal CVD oxide/PECVD oxide alternating layer structure is removed. The capacitor storage node structure which consists of the first polysilicon layer and the second polysilicon layer is then accomplished.

Since the thermal CVD oxide/PECVD oxide alternating layer structure is corrugated, the second polysilicon spacers are also corrugated which increased the surface area of the capacitor considerably.

After the storage node of the DRAM capacitor is completed, the dielectric layer and the top plate of the capacitor are formed by standard integrated circuit technologies. Therefore, the single-side corrugated cylindrical capacitor structure of a high density DRAM is finally accomplished.

BRIEF DESCRIPTION OF THE DRAWINGS

The accompanying drawings forming a material part of this description, in which.

DESCRIPTION OF THE PREFERRED EMBODIMENT

The invention discloses herein is directed to a method of fabricating the single-side corrugated cylindrical capacitor of high density DRAMs. The drawing figures are illustrated a partially completed integrated circuit device. In the following description, numerous details are set forth in order to provide a thorough understanding of the present invention. It will be appreciated by one skilled in the art that variations of these specific details are while still achieving the results of the present invention. In other instance, well-known processing steps are not described in detail in order not unnecessarily to obscure the present invention.

Figure 2:
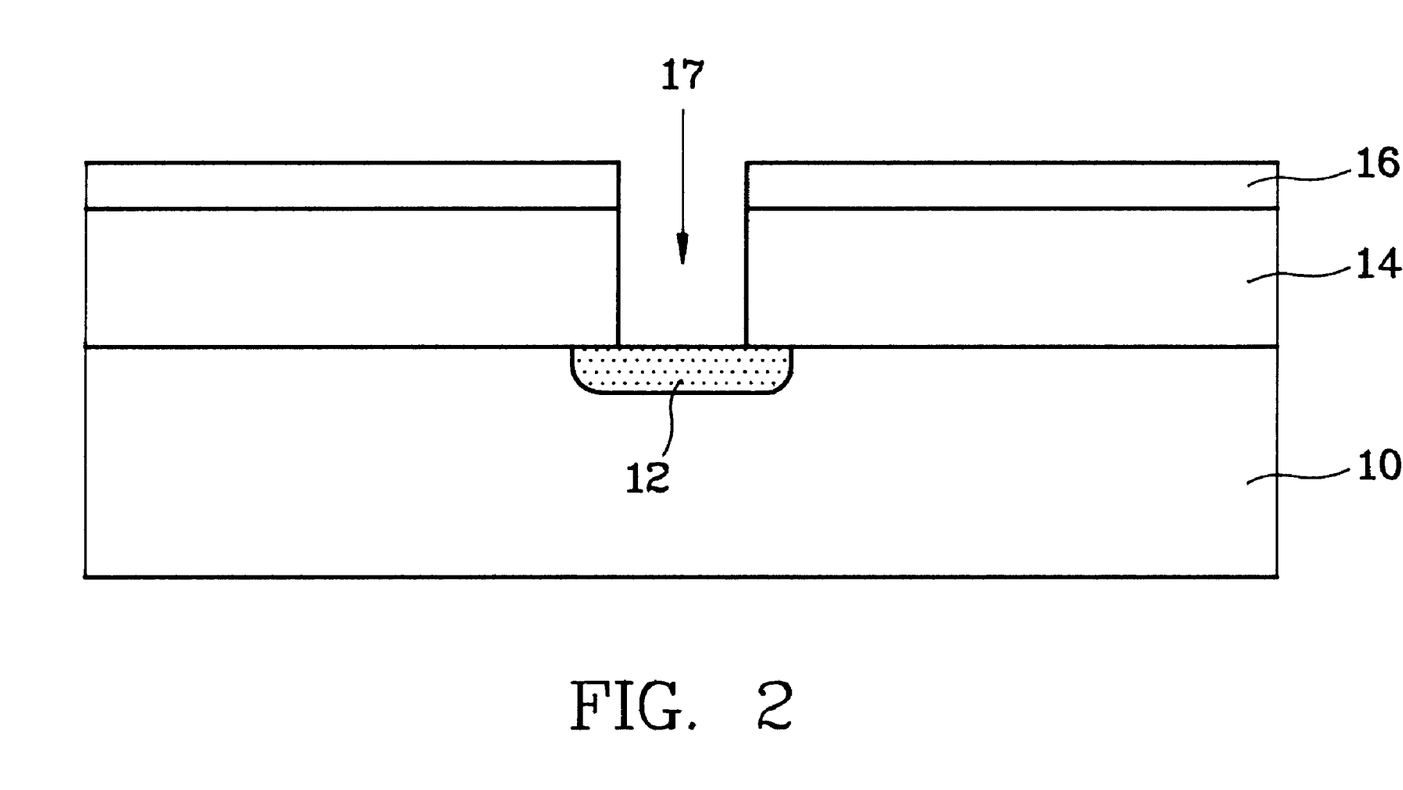
FIG. 2 is a cross sectional representation of a DRAM cell after the cell contact window of the MOSFET is formed.

Referring now more particularly to FIG. 2, there is shown a portion of partially completed Metal-Oxide-Semiconductor Field Effect Transistor (MOSFET). A MOSFET region is usually consist of a gate oxide, gate electrode, pad oxide, lightly doped region, spacers, source and drain. For simplicity reason, FIG. 2 only shows the source region of a MOSFET which is fabricated on a P-type semiconductor silicon substrate 10. The source region 12 of the MOSFET which is formed by ion implantation technique, is preferably doped with arsenic ($As^{75}$) or phosphorus ($P^{31}$) ions, with an implantation dose of 2E15 to 5E16 $cm^{-2}$, and an implantation energy of 30 to 80 keV.

Referring to FIG. 2 again, the first dielectric 14 and second dielectric 16 layers are continuously deposited on the silicon substrate 10. The first dielectric layer 14 is usually using undoped silicon oxide which is formed by low pressure CVD (LPCVD) technique under the following condition: the temperature is about 720° C., and pressure is about 0.25 torr, with reactant gases of $Si(C_2H_5O)_4$, $N_2O$ and $O_2$. The thickness of the first dielectric layer 14 is about 3000 to 8000 Angstroms. The second dielectric layer 16 is usually using undoped silicon oxide which is formed by the same method as the first dielectric layer 14. The thickness of the second dielectric layer 16 is about 500 to 1500 Angstroms.

Still referring to FIG. 2, the first dielectric and second dielectric layers are partially etched to open a cell contact window 17 for the source 12 of the MOSFET by conventional lithography and plasma-etching techniques. The plasma etching process can use magnetic enhanced reactive ion etching (MERIE), electron cyclotron etching (ECR) or reactive ion etching (RIE) methods with reactant gases such as $CF_4$ $CHF_3$ and Ar.

Figure 3:
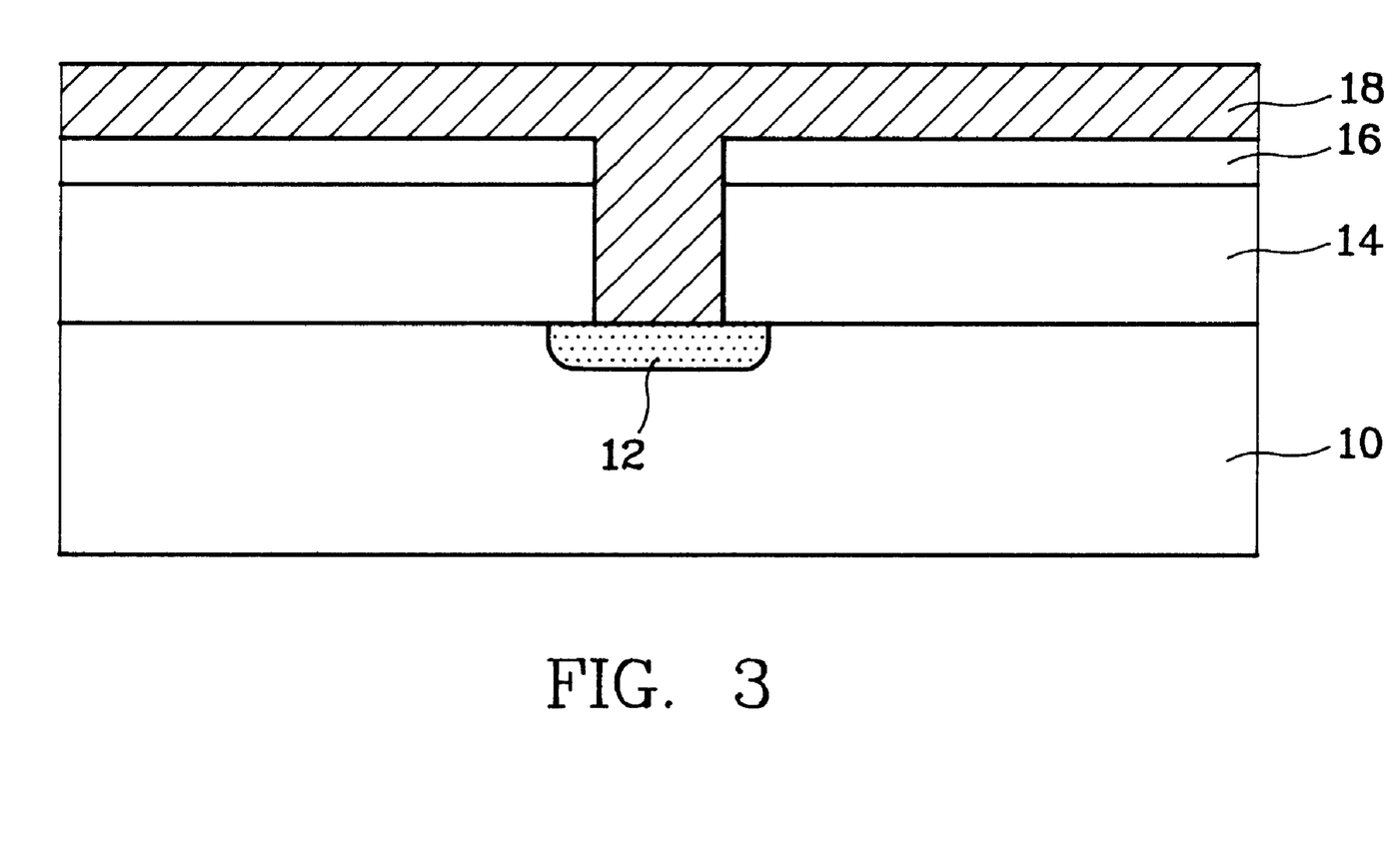
FIG. 3 is a cross sectional representation of the DRAM cell of FIG. 2 after the first polysilicon layer is deposited.

Referring now to FIG. 3, the first polysilicon layer 18 which is overlaying the second dielectric layer 16 and filling into the cell contact window 17 is deposited. The first polysilicon layer 18 is usually formed by in-situ phosphorus doped LPCVD method under a mixture of (15% $PH_3$+85% $SiH_4$) and (5% $PH_3$+95% $N_2$), at the temperature about 550° C. to obtain a thickness of between 1000 to 4000 Angstroms.

Figure 4:
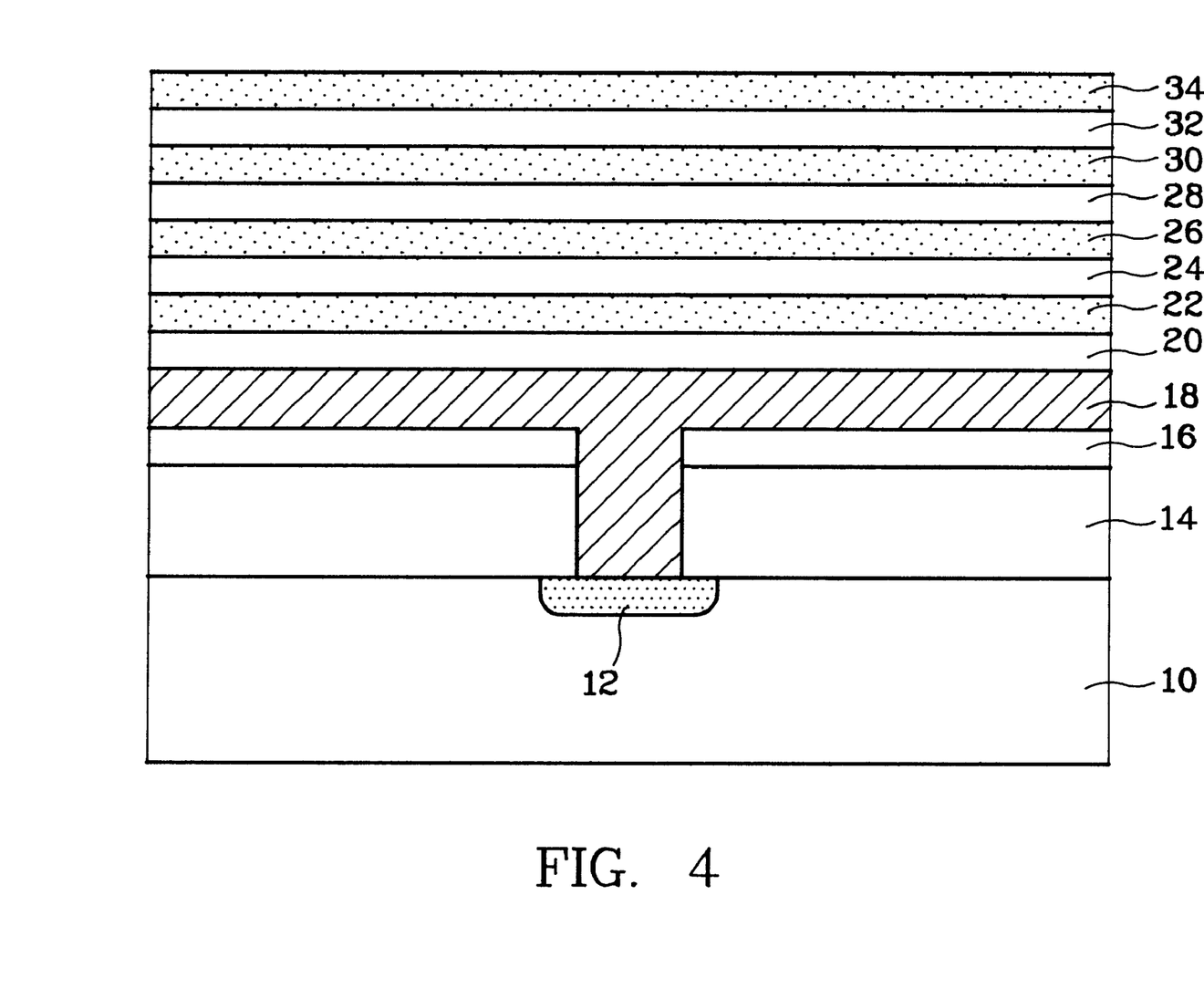
FIG. 4 is a cross sectional representation of the DRAM cell of FIG. 3 after the thermal CVD oxide/PECVD oxide alternating layers are formed.

Referring now to FIG. 4, the nitride layer 20 which has a thickness of 500 to 1500 Angstroms is formed for etching stopper by LPCVD technique under the following conditions: the pressure is between 200 to 400 mTorr, with a temperature of about 720° C., and reactant gases $SiH_2Cl_2$ and $NH_3$ flowing.

Referring to FIG. 4 again, the first thermal CVD oxide 22 and the first PECVD oxide 24 layers are formed overlaying the nitride dielectric layer. Then this step is repeated for several times to produce the second thermal CVD oxide 26, the second PECVD oxide 28, the third thermal CVD oxide 30, the third PECVD oxide 32, and the fourth thermal CVD oxide 34 alternating layers as shown in FIG. 4. The thickness of each oxide layer is about 200 to 400 Angstroms. The thermal CVD oxide process uses a gas stream of $SiH_2Cl_2$ and $N_2O$ or $SiH_4$ and $O_2$, at a fairly high temperature in the range of 750 to 900° C. The PECVD oxide is generally deposited under a power of 200 to 800 Watts, and in the temperature range of 300 to 400° C., with a gas stream of $SiH_4$ and $O_2$. Alternatively, the thermal CVD oxide can be replaced by either atmosphere CVD (APCVD) or sub atmosphere CVD (APCVD) oxides.

Figure 5:
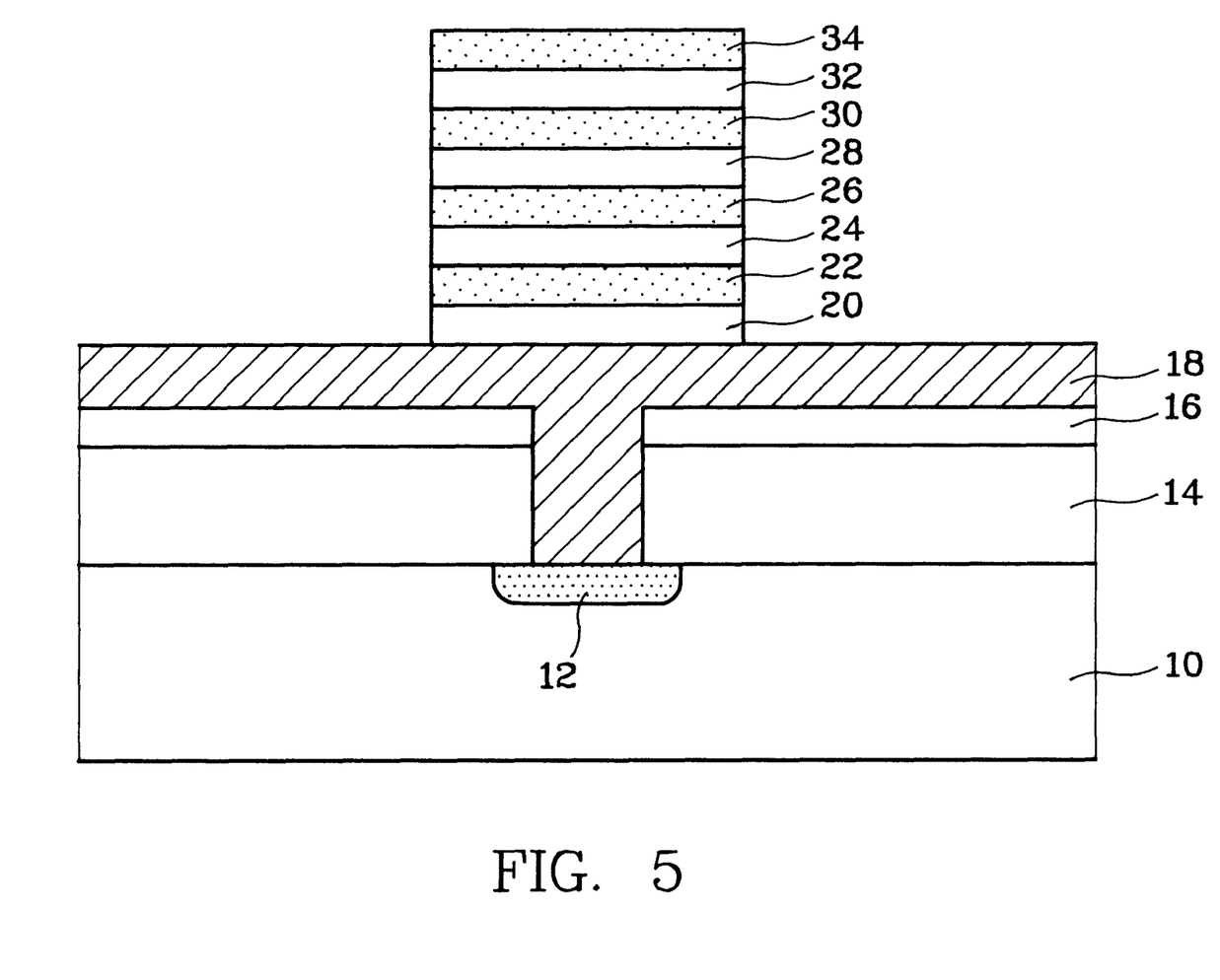
FIG. 5 is a cross sectional representation of the DRAM cell of FIG. 4 after the thermal CVD oxide/PECVD oxide alternating layer structure is patterned.

Referring now to FIG. 5, the thermal CVD oxide and the plasma-PECVD oxide alternating layers are formed capacitor pattern by the conventional lithography and plasma-etching techniques. The plasma-etching is stopped by the nitride layer 20 without damaging the first polysilicon layer 18. The oxide plasma-etching process can also use MERIE method with reactant gases such as $CF_4$, $CHF_3$ and Ar.

Figure 6:
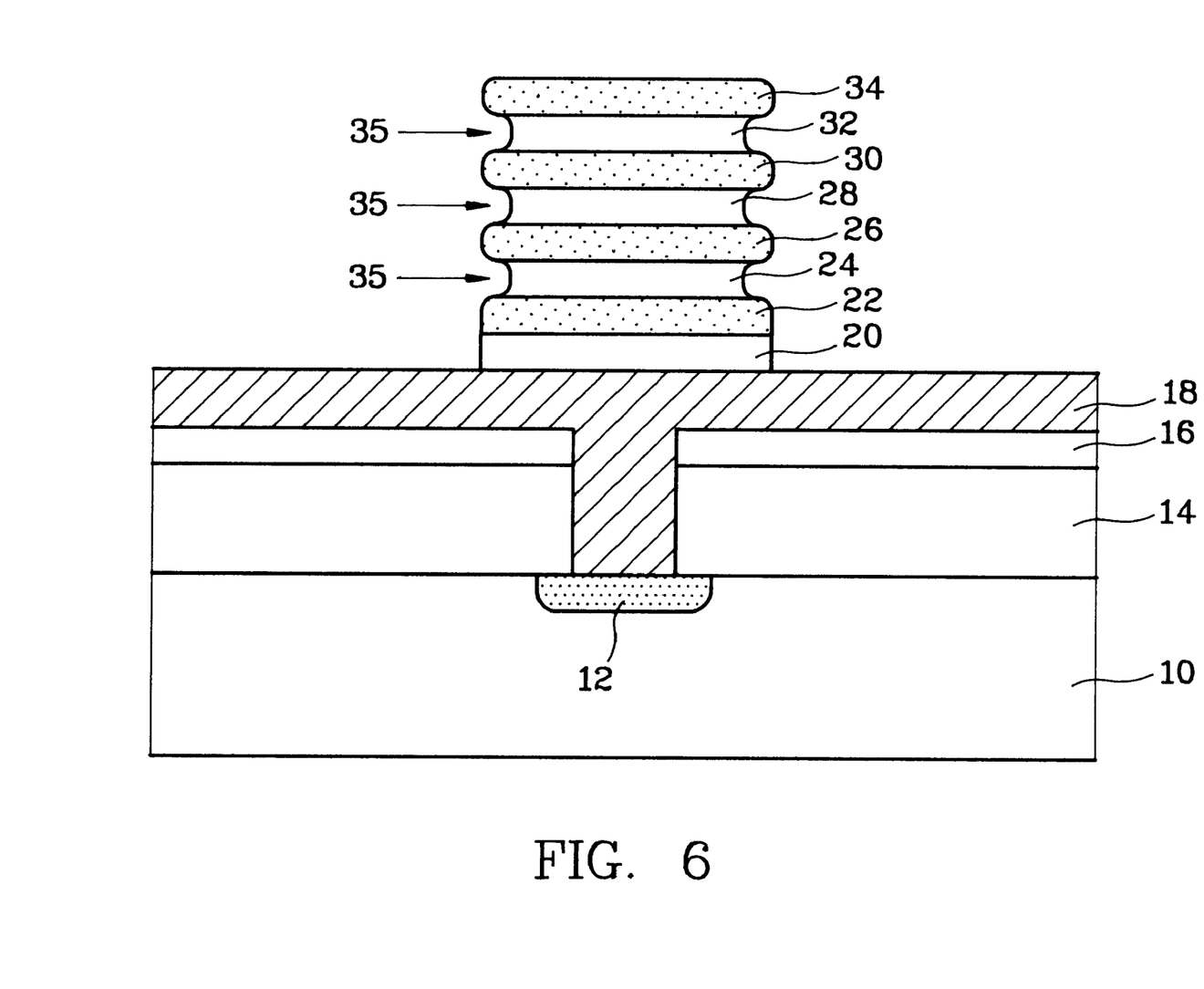
FIG. 6 is a cross sectional representation of the DRAM cell of FIG. 5 after the thermal CVD oxide/PECVD oxide alternating layer structure is lateral etched by BF acid.

Referring now to FIG. 6, the thermal CVD oxide and the PECVD oxide alternating layer structure is lateral etched by hydrofluoric acid (HF). Because hydrofluoric acid (HF) etches the thermal CVD oxide at a slower rate than etches the PECVD oxide, a cavity 35 is formed in each PECVD oxide layer as shown in FIG. 6. The PECVD oxide and the thermal CVD oxide have an HF etching rate ratio at least 4:1 and can be as high as 15:1 which is depended on the PECVD oxide deposition parameters such as temperature, pressure or power. An HF concentration of about 0.5 to 20% is used in this embodiment. Therefore, the single-side corrugated shape capacitor surface is created.

Figure 7:
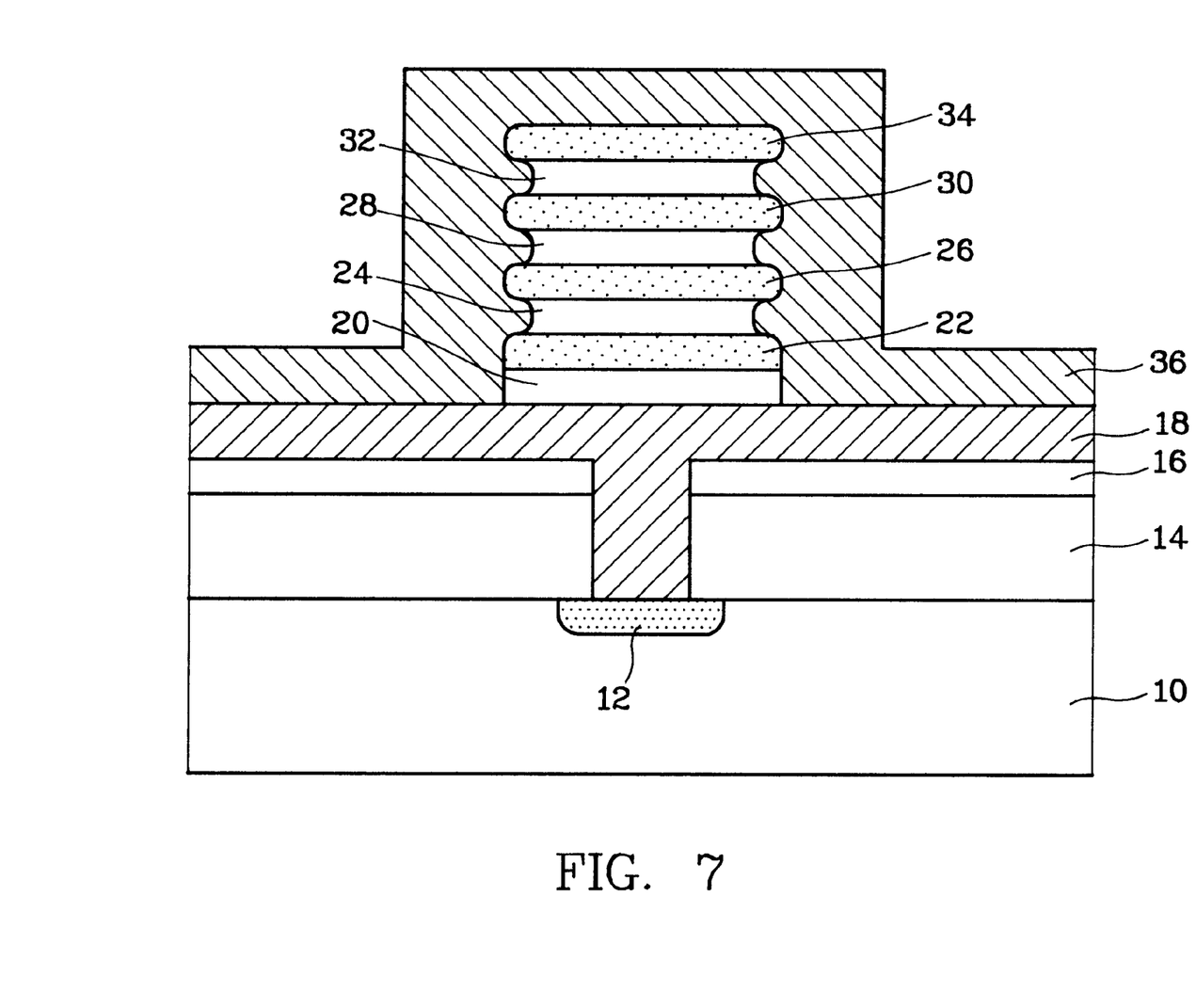
FIG. 7 is a cross sectional representation of the DRAM cell of FIG. 6 after the second polysilicon layer is formed.

Referring now to FIG. 7, the second polysilicon layer 36 is deposited overlaying the structure of FIG. 6. The second polysilicon layer 36 is also formed by in-situ phosphorus doped LPCVD method as first polysilicon layer 18. But the thickness of second polysilicon layer 36 is only about 1000 to 2500 Angstroms.

Figure 8:
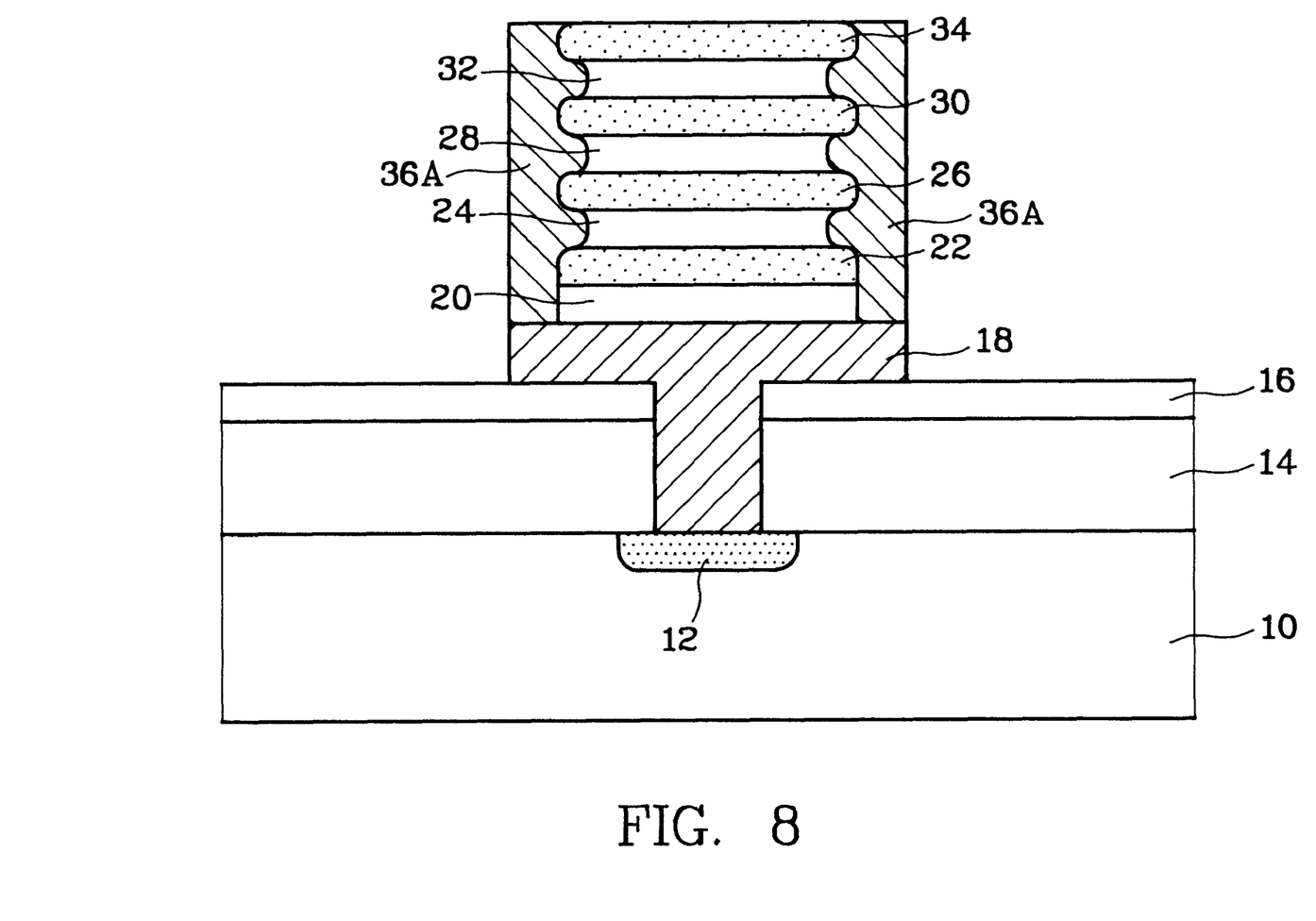
FIG. 8 is a cross sectional representation of the DRAM cell of FIG. 7 after the second polysilicon layer is anisotropically etched to form second polysilicon spacers on the sidewalls of the thermal CVD oxide/PECVD oxide alternating layer structure.

Referring now to FIG. 8, the second polysilicon layer 36 and first polysilicon layer 18 are then anisotropically etched to form the second polysilicon spacers 36A which are located on the sidewalls of the thermal CVD oxide and the PECVD oxide alternating layer structure. The plasma-etching process for the second polysilicon layer can still use MERIE method with reactant gases such as $Cl_2$, $SF_6$ and HBr.

Figure 9:
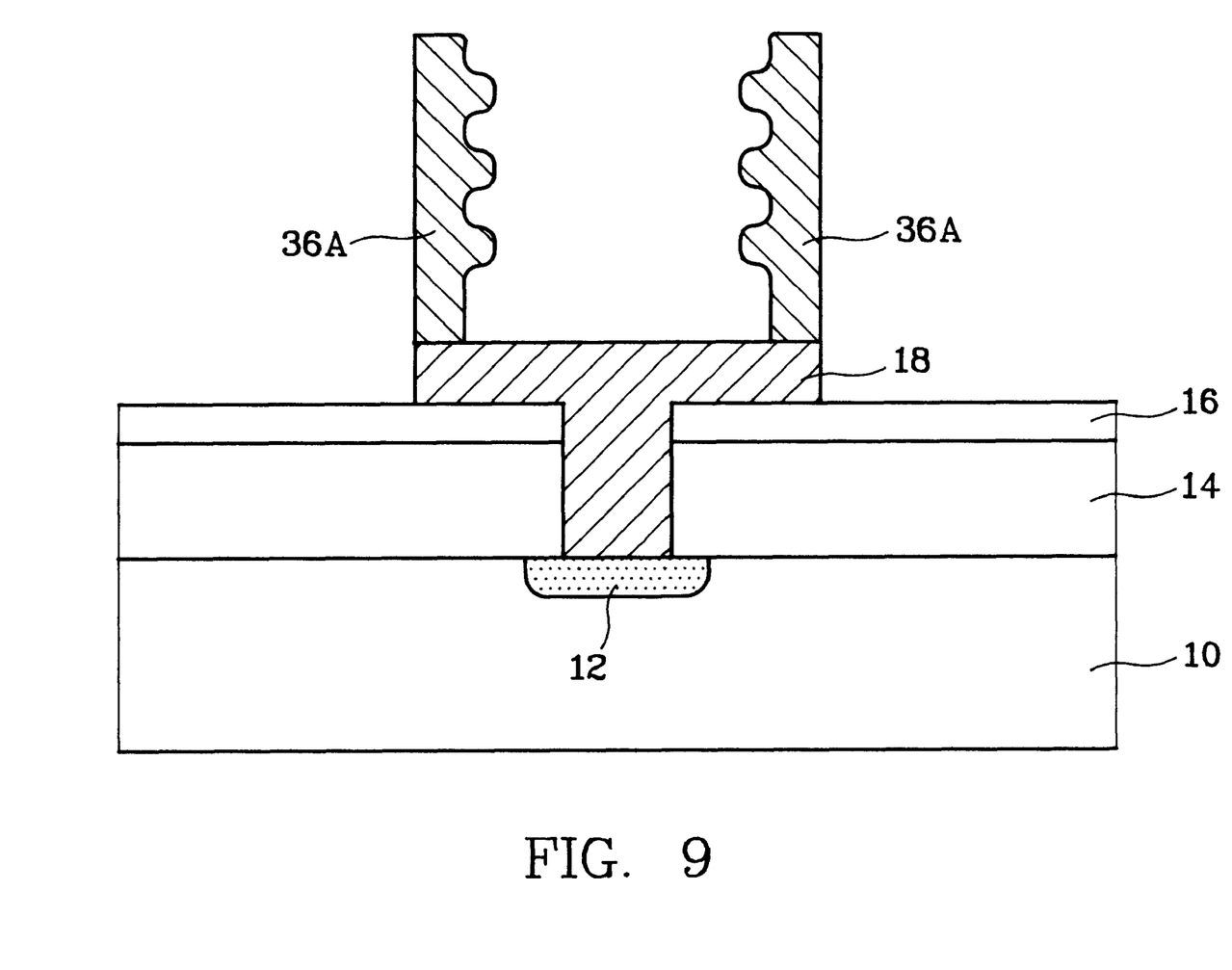
FIG. 9 is a cross sectional representation of the DRAM cell after the thermal CVD oxide/PECVD oxide alternating layer structure is removed to complete the single-side corrugated cylindrical capacitor storage node formation.

Referring now to FIG. 9, the thermal CVD oxide and the PECVD oxide alternating layer structure is removed by hydrofluoric acid solution or vapor, and is preferable using hydrofluoric vapor which is more effective. The single-side corrugated storage node of the DRAM capacitor which is consist of the remaining first polysilicon layer 18 and the second polysilicon spacers 36A is finally completed as shown in FIG. 9.

Figure 10:
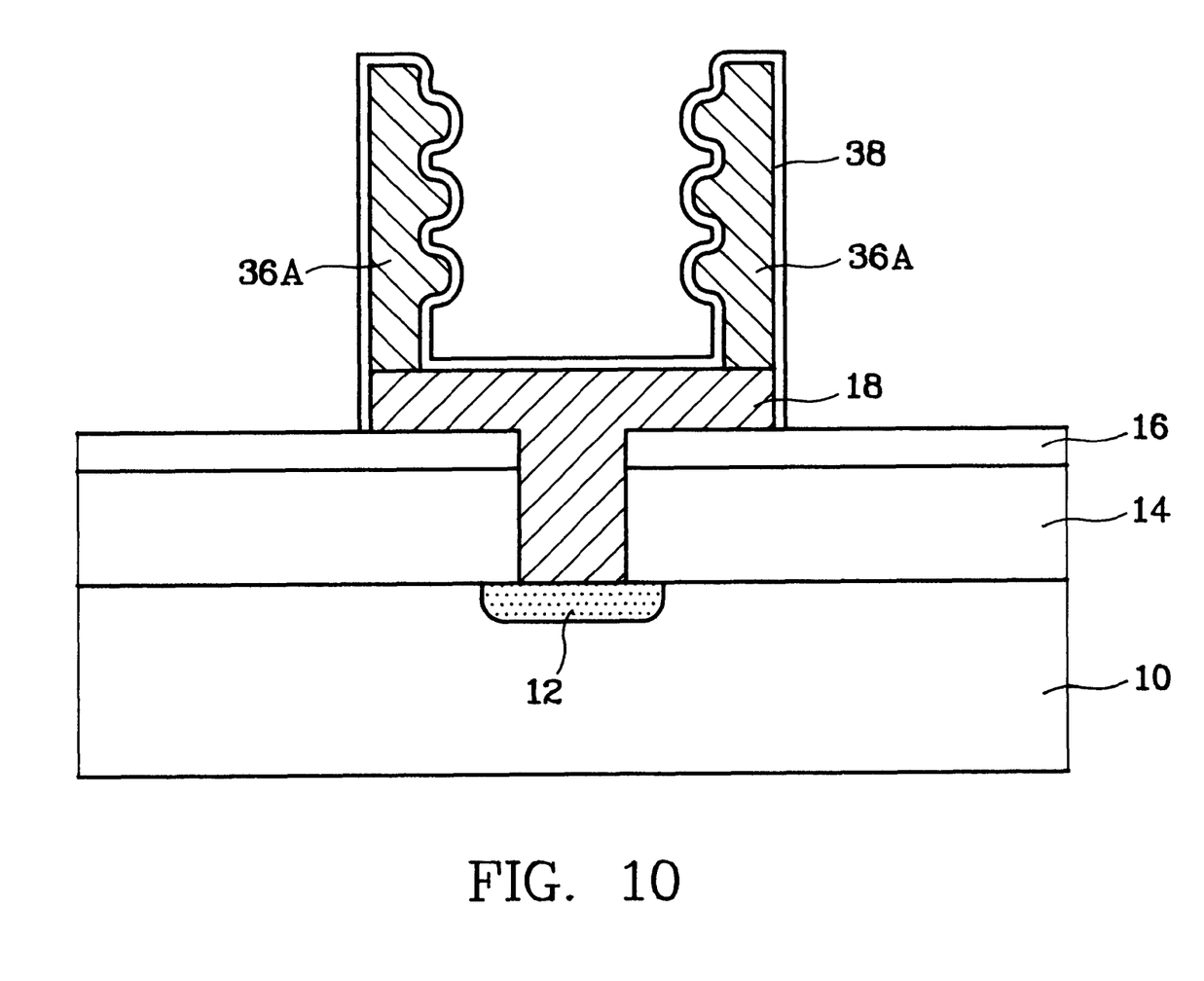
FIG. 10 is a cross sectional representation of the DRAM cell after the capacitor dielectric layer is formed.

Referring now to FIG. 10, the dielectric layer 38 is formed by standard integrated circuit processing procedure. The capacitor dielectric layer 38 is usually using nitride oxide (NO) doublelayer or oxide/nitride/oxide (ONO) triplelayer or even tantalum oxide ($Ta_2O_5$) material. The thickness of the capacitor dielectric layer 38 is about 20 to 100 Angstroms.

Figure 11:
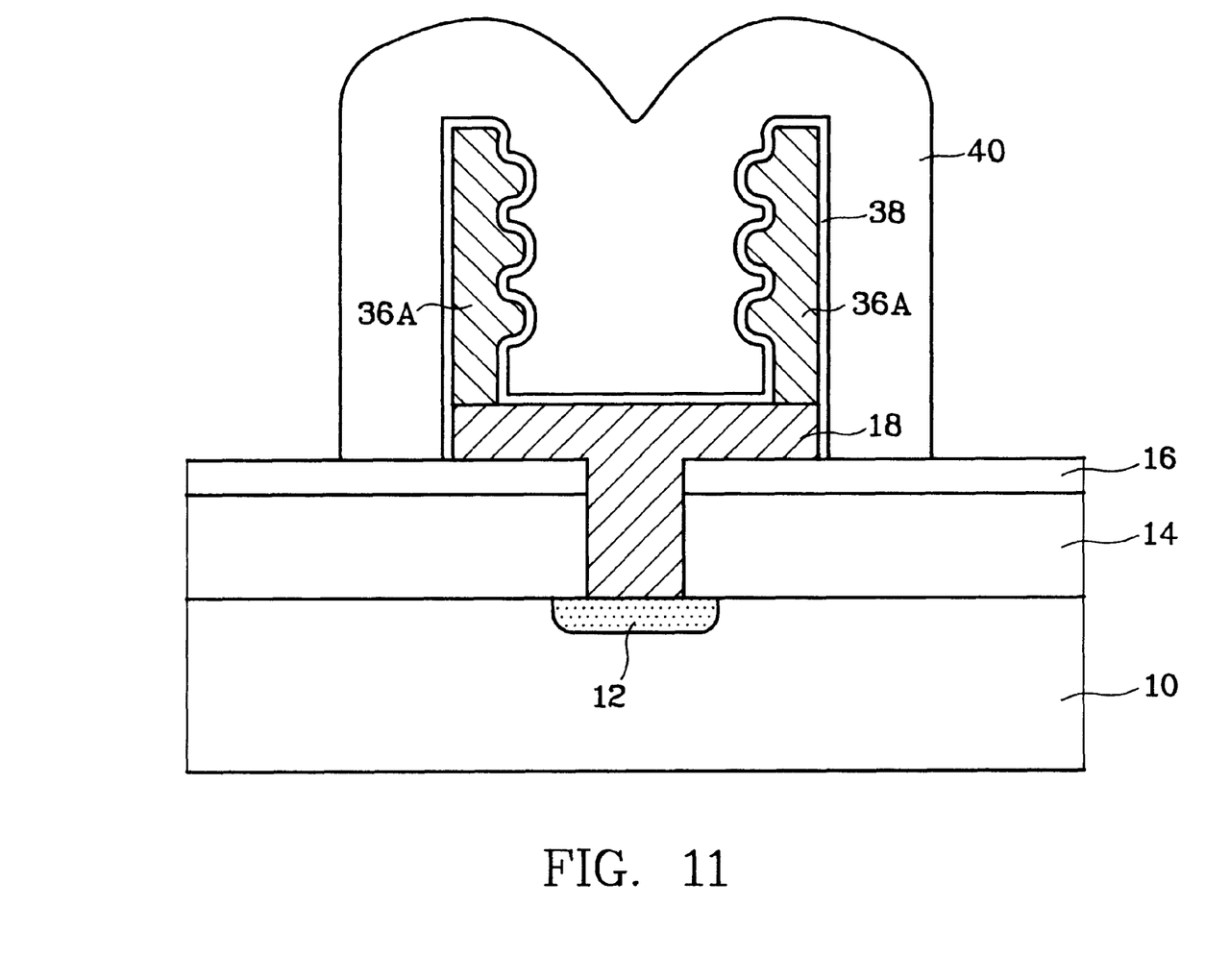
FIG. 11 is a cross sectional representation of the DRAM cell after the final capacitor structure is completed.

Referring now to FIG. 11, finally, the third polysilicon layer 40 is deposited overlaying the capacitor dielectric layer 38. The thickness of the third polysilicon layer 40 is about 1000 to 2000 Angstroms. The third polysilicon top electrode is then patterned by the conventional lithography and plasma-etching techniques.

The single-side corrugated cylindrical capacitor storage node of the present invention has much greater surface area so as to increase the capacitance value of the DRAM capacitor, that can achieve high packing density of the integrated circuit devices.

While the invention has been particularly shown and described with reference to a preferred embodiment, it will be understood by those skilled in the art that various changes in form and detail may be made therein without departing from the spirit and scope of the present invention.

What we claimed is:

1. A method of fabricating capacitors of a DRAM cell, said method comprising the steps of:

(a) forming MOSFET structures on a silicon substrate, wherein said MOSFET comprises a gate oxide, gate electrode and drain/source regions;

(b) continuously forming first, and second dielectric layers overlaying a surface of said silicon substrate;

(c) partially etching said first, and second dielectric layers to open a cell contact window for said source region of said MOSFET;

(d) forming a first polysilicon layer overlaying said second dielectric layer and filling in said cell contact window;

(e) forming a third dielectric layer as etch stopping layer of a nitride having a thickness of from 500 to 1500 Angstroms;

(f) alternately depositing first etch type oxide layers and second etch type oxide layers to form oxide alternating layers, said first etch type oxide layers etch slower than second etch type oxide layers during sequential lateral etching;

(g) partially etching said third dielectric layer, said first etch type oxide layers and said second etch type oxide layers to form a capacitor pattern;

(h) laterally etching said first etch type oxide layers and said second etch type oxide layers to form cavities therein said second etch type oxide layers;

(i) forming a second polysilicon layer overlaying said first polysilicon layer and said oxide alternating layers;

(j) anisotropically etching said second polysilicon and said first polysilicon layers to form second polysilicon spacers on the sidewalls of said alternating layers;

(k) removing said oxide alternating layers and said third dielectric layer, the storage node of said capacitor which consists of the remaining said first polysilicon layer and said second polysilicon spacers is constructed;

(l) forming a capacitor dielectric layer overlaying said storage node of the capacitor;

(m) forming a third polysilicon layer overlaying said capacitor dielectric layer;

(n) partially etching said third polysilicon layer and said capacitor dielectric layer to form a top electrode of the capacitor.

2. The method of claim 1, wherein said first polysilicon layer is formed which has a thickness of 1000 to 4000 Angstroms by LPCVD technique.

3. The method of claim 1, wherein said first etch type oxide layer is made of thermal CVD oxide, which has a thickness of 200 to 400 Angstroms.

4. The method of claim 1, wherein said first etch type oxide layer is made of atmosphere CVD (APCVD) oxide, which has a thickness of 200 to 400 Angstroms.

5. The method of claim 1, wherein said first etch type oxide layer is made of sub atmosphere CVD (SACVD) oxide, which has a thickness of 200 to 400 Angstroms.

6. The method of claim 1, wherein said second etch type oxide layer is made of plasma enhanced CVD (PECVD) oxide, which has a thickness of 200 to 400 Angstroms.

7. The method of claim 1, wherein said laterally etching is performed by hydrofluoric acid (BF) whose concentration is between 0.5% and 20%.

8. The method of claim 1, wherein said capacitor dielectric layer is selected from the group of materials comprising nitride/oxide (NO) doublelayer, oxide nitride oxide (ONO) triplelayer and tantalum oxide ($Ta_2O_5$), which has a thickness of 20 to 100 Angstroms.

* * * * *